(12) United States Patent
Morelle et al.

(10) Patent No.: US 8,039,973 B2
(45) Date of Patent: Oct. 18, 2011

(54) ELECTRONIC MODULE HAVING A MULTI-LAYER CONDUCTOR FOR REDUCING ITS RESISTIVITY AND A METHOD OF ASSEMBLING SUCH A MODULE

(75) Inventors: Jean-Michel Morelle, Beaugency (FR); Laurent Vivet, Bois D'Arcy (FR); Mathieu Medina, Versailles (FR); Renan Leon, Versailles (FR)

(73) Assignee: Valeo Etudes Electroniques, Creteil (FR)

( * ) Notice: Subject to any disclaimer, the term of this patent is extended or adjusted under 35 U.S.C. 154(b) by 95 days.

(21) Appl. No.: 12/223,071

(22) PCT Filed: Jan. 30, 2007

(86) PCT No.: PCT/FR2007/050710
§ 371 (c)(1),
(2), (4) Date: Sep. 22, 2008

(87) PCT Pub. No.: WO2007/085774
PCT Pub. Date: Aug. 2, 2007

(65) Prior Publication Data
US 2009/0179336 A1    Jul. 16, 2009

(30) Foreign Application Priority Data
Jan. 30, 2006 (FR) .................................. 06 00841

(51) Int. Cl.
*H01L 23/48* (2006.01)
*H01L 23/52* (2006.01)
*H01L 29/40* (2006.01)

(52) U.S. Cl. ......... 257/784; 257/779; 257/734; 257/748
(58) Field of Classification Search .................. 257/706, 257/707, 713, 718, 719, 720, 782, 783, 777, 257/779, 690, 734, 748, 784, E23.033; 438/612
See application file for complete search history.

(56) References Cited

U.S. PATENT DOCUMENTS

| | | | | |
|---|---|---|---|---|
| 3,795,037 | A * | 3/1974 | Luttmer | 29/883 |
| 4,606,962 | A | 8/1986 | Reylek et al. | |
| 4,688,150 | A * | 8/1987 | Peterson | 361/771 |
| 4,759,994 | A | 7/1988 | Lesourd | |
| 5,069,978 | A | 12/1991 | Mizuhara | |
| 5,438,477 | A * | 8/1995 | Pasch | 361/689 |
| 6,063,648 | A | 5/2000 | Beroz et al. | |
| 6,086,386 | A * | 7/2000 | Fjelstad et al. | 439/70 |
| 6,104,087 | A * | 8/2000 | DiStefano et al. | 257/696 |
| 6,274,823 | B1 * | 8/2001 | Khandros et al. | 174/261 |

(Continued)

FOREIGN PATENT DOCUMENTS
WO    WO 2004/100258 A2    11/2004

*Primary Examiner* — Ha Tran T Nguyen
*Assistant Examiner* — Thanh Y Tran
(74) *Attorney, Agent, or Firm* — Oliff & Berridge PLC

(57) ABSTRACT

The module is of the type comprising an electronic component provided with a conductive face that is electrically connected to a connection member of the component by means of a conductor that is corrugated at least in part so as to define an alternating sequence of oppositely-directed arcs, a first series of arcs being connected to the conductive face of the electronic component. The conductor also includes a second series of arcs opposite to the arcs of the first series and interposed between the arcs of the first series, the second series of arcs being connected to the conductive face of the connection member.

12 Claims, 1 Drawing Sheet

U.S. PATENT DOCUMENTS

| | | |
|---|---|---|
| 6,384,475 B1 | 5/2002 | Beroz et al. |
| 6,777,963 B2 * | 8/2004 | Rutten ............... 324/754 |
| 7,199,476 B2 * | 4/2007 | Hill ................... 257/772 |
| 7,435,102 B2 * | 10/2008 | Goodman ............ 439/70 |
| 2004/0099944 A1 * | 5/2004 | Kimura ............... 257/706 |
| 2004/0217488 A1 | 11/2004 | Luechinger |
| 2005/0040540 A1 * | 2/2005 | Haba et al. ......... 257/778 |
| 2005/0269694 A1 | 12/2005 | Luechinger |
| 2007/0141755 A1 | 6/2007 | Luechinger |

\* cited by examiner ns.
ELECTRONIC MODULE HAVING A MULTI-LAYER CONDUCTOR FOR REDUCING ITS RESISTIVITY AND A METHOD OF ASSEMBLING SUCH A MODULE The present invention relates to an electronic module and to a method of assembling such a module.

The invention applies in particular to a power module for a motor vehicle, e.g. a module for performing switching functions.

BACKGROUND OF THE INVENTION

In the state of the art, and in particular from WO 2004/100258, there is known more particularly a module of the type comprising an electronic component provided with a conductive face that is electrically connected to a connection member of the component by means of a conductor that is corrugated at least in part so as to define an alternating sequence of oppositely-directed arcs, a first series of arcs being connected to the conductive face of the electronic component.

By way of example, in such a module, the electronic component comprises a semiconductor chip arranged on a substrate. The conductive face is generally metallized, e.g. covered in a film of metal.

By way of example, the connection member comprises connection means for connecting the component to its environment, to heat dissipation means, or to a second electronic component.

A power module for a motor vehicle carries relatively high currents, and such a module is generally installed in an environment that is subjected to high temperatures.

It is therefore desirable for the module to give off as little heat as possible, and consequently for its resistance to be as low as possible, in order to avoid the electronic component being damaged because of too high a surrounding temperature.

For this purpose, the conductor described in WO 2004/100258 has the general shape of a tape, and it has a first end connected to the connection member and a second end that is corrugated, defining alternating oppositely-directed arcs.

Each of the arcs of the first series is bonded to the conductive face of the electronic component so as to establish a multiple contact zones between said face and the conductor.

Those multiple contact zones between the conductive face and the conductor serve to limit the length of the path followed by current in the metalized conductive face, and consequently to reduce the resistance thereof, thereby limiting heat dissipation by said face.

Nevertheless, in WO 2004/100258, the path followed by the current between the two ends of the conductor is relatively long, such that a relatively large quantity of energy is dissipated by the Joule effect in the conductor, and that can also give rise to a large rise in temperature in the vicinity of the electronic component.

OBJECT AND SUMMARY OF THE INVENTION

A particular object of the invention is to reduce significantly the amount of energy that is dissipated by the Joule effect in the conductor, and thus the heat that is transmitted to the electronic component.

To this end, the invention provides a module of the above-specified type, wherein the conductor includes a second series of arcs opposite to the arcs of the first series and interposed between the arcs of the first series, the second series of arcs being connected to the conductive face of the connection member.

Thus, the length of the path followed by the current flowing from the electronic component towards the connection member is no longer equal to the length of the conductor, but to the length of half an arc. The resistance of the conductor and the energy dissipated in the form of heat by the Joule effect are directly proportional to the length of the path followed by the current, so there is a great reduction in the risk of the electronic component being damaged by a rise in temperature due to energy being dissipated by the Joule effect in the conductor.

In addition, because of the first series of arcs, the conductor is connected to the electronic component via multiple zones that are distributed over the conductive face of the electronic component and through which the current flows between the component and the conductor. As a result, this distribution of current flow zones enables the heat that is dissipated by the Joule effect to be spread over the conductive face of the component, thereby limiting temperature in those zones. This makes it possible to further reduce any risk of damaging the electronic component.

Furthermore, in the module of the invention, because of the second series of arcs of the conductor, the area of contact between the conductor and the connection member is larger than it is in the state of the art. However, in conventional manner, the connection member can constitute heat dissipation means and the conductor also conducts heat. The module of the invention thus also makes it possible to remove heat more effectively from the vicinity of the electronic component. Any risk of the component being damaged is thus further reduced.

In addition, the module of the invention is less bulky, and is thus well adapted to most systems in which space availability is a very important factor.

Optionally, the electronic component comprises a semiconductor chip.

The module of the invention is particularly well adapted under such circumstances. Semiconductor chips are very fragile and they are not easily connected directly to other elements by conventional means (soldering, etc), which conventional means are likely to damage such chips.

Advantageously, the conductor has the general shape of a tape.

This shape is advantageous since it makes it possible to increase the section of the conductor, and thus to increase its area of contact with the various elements of the module, but without that increasing the overall size of the module in troublesome manner.

Furthermore, the conductor in the form of a corrugated ribbon possesses suitable mechanical properties, in particular suitable stiffness, for forming effective support means for the connection member.

Advantageously, the conductor is a multi-layer conductor.

Thus, where necessary, the conductor may comprise: a layer of a material that is particularly suitable for making a connection with the electronic component; a layer of a material that is particularly suitable for connection with the connection member; and a layer of material that is highly conductive, this layer serving to further reduce the resistance of the conductor, specifically by reducing its resistivity.

Optionally, the arcs of the conductor are of substantially constant height.

Optionally, the module forms an electronic power module for a motor vehicle.

In a particular embodiment, the first series of arcs of the conductor is bonded to the electronic component.

The present invention also provides a method of assembling a module of the invention, the method comprising at least a step of bonding the first series of arcs of the conductor to the conductive face of the electronic component, and subsequently comprising a step of positioning the connection member in contact with the second series of arcs of the conductor, followed by a step of connecting the connection member to the conductor.

In a first implementation, the step of connecting the connection member to the conductor includes a step of applying holding pressure to the connection member for holding said connection member against the conductor.

In a second implementation, the step of connecting the connection member to the conductor includes at least one bonding step, with or without addition of material, for bonding the connection member to the conductor.

An example of bonding without addition of material is ultrasound welding. An example of bonding with addition of material could be soldering.

Under such circumstances, the connection step is preceded by a step of protecting the electronic component.

This protection may be temporary or permanent, and it serves to protect the electronic component that might be damaged by the operation of making a connection by bonding, e.g. because of material being splashed onto the component.

In a particular implementation, the protection step comprises a step of depositing a polymer layer on the electronic component so that the layer covers the conductive face of the component.

BRIEF DESCRIPTION OF THE DRAWING

The invention can be better understood on reading the following description, given purely by way of example and made with reference to the accompanying drawing, in which.

MORE DETAILED DESCRIPTION

Figure 1:
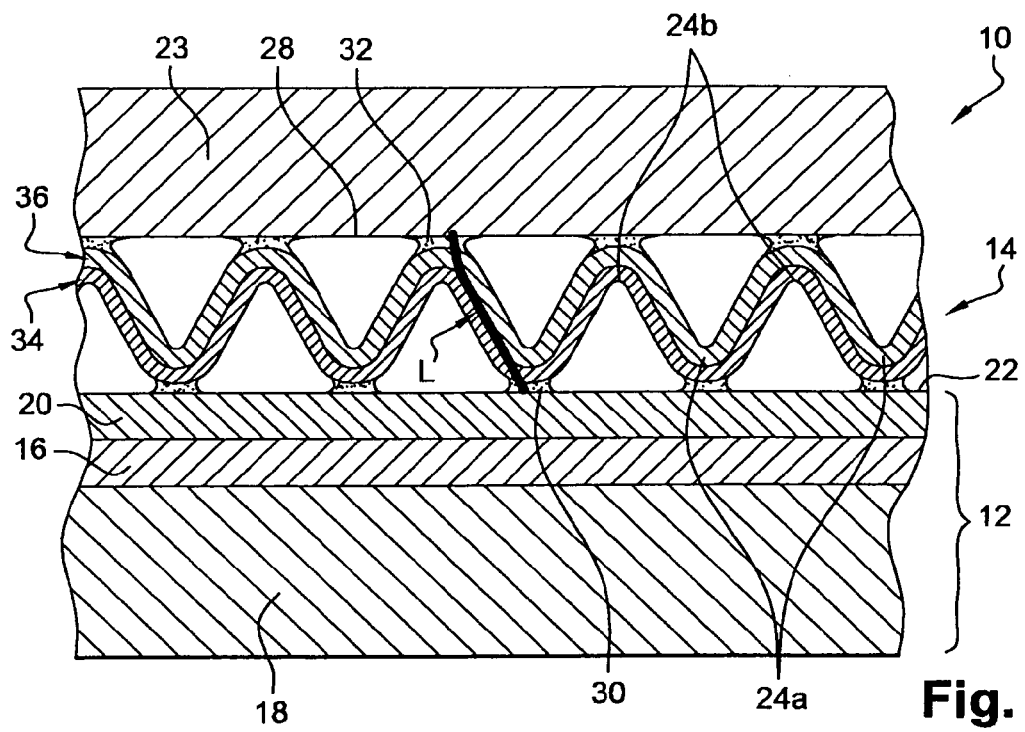
FIG. 1 is a longitudinal section through a module of the invention.
Figure 2:
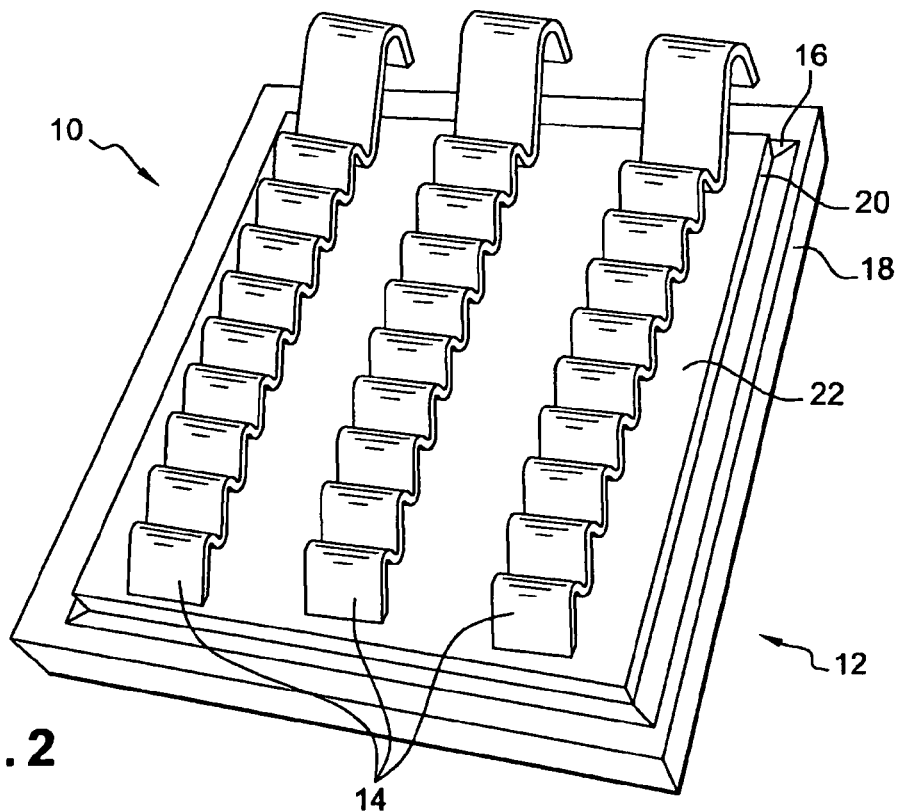
FIG. 2 is a perspective view from above showing a module of the invention prior to connection with the connection member.

FIGS. 1 and 2 show a module 10 comprising an electronic component 12 and conductors 14, e.g. three conductors. In the example described, such a module 10 is a power module, e.g. used in a motor vehicle.

The electronic component 12 comprises a semiconductor chip 16 disposed on a substrate 18, the substrate forming both an electrical insulator and a heat dissipater. By way of example, the electronic component may be a non-integrated transistor such as a metal oxide on silicon field effect transistor (MOSFET) or a junction gate field effect transistor (JFET). This semiconductor chip 16 is covered in a metal film 20 that forms a conductive face 22 of the component 12, designed to be electrically connected to other elements, such as a connection member 23.

In this example, the connection member 23 is a connector that enables the electronic component 12 to be connected electrically to other electronic components.

The conductors 14 are generally in the form of tapes and they are corrugated. They are connected to the conductive face 22 and to the connection member 23. They extend longitudinally, substantially parallel to one another.

As can be seen more clearly in FIG. 1, each of the conductors 14 defines alternating oppositely-directed arcs 24a, 24b, these arcs having substantially the same height.

A first series of arcs 24a is connected to the conductive face 22 of the metal film 20, while a second series of arcs 24b, opposite from the arcs 24a of the first series and interposed between the arcs 24a, is connected to a conductive face 28 of the connection member 23.

The faces 22 and 28 are substantially mutually parallel and they occupy two mutually-parallel planes of contact with the conductors 14, being flush with the tops and with the bottoms of the arcs 24a and 24b.

Thus, the conductor ribbon has at least one zone 30 in contact with the conductive face 22, and at least one zone 32 in contact with the conductive face 28 of the connection member 23. The zones 30 and 32 are all at the same potential.

Each conductor 14 is also a multi-layer conductor. More particularly, it has a layer 34 of aluminum in contact with the face 22 of the component 12, and a layer 36 of copper in contact with the connection member 23. The copper layer 36 gives high resistivity to the conductor 14 while being compatible with the connection member 23. The aluminum layer 34 enables the conductor to be compatible with the metal film 20.

In the module of the invention, and as shown more particularly in FIG. 1, current follows a path L that is very short along the conductor 14, being of length equal to half the length of one arc.

Thus, the electrical resistance of the conductor is greatly decreased, and the energy dissipated in the form of heat in the module is also decreased. In addition, the multiple electrical and thermal contact zones 32 between the conductor 14 and the connection element 23, which also acts as a heat dissipater, make it possible to regulate temperature effectively in the vicinity of the semiconductor chip 16, and thus to avoid it becoming damaged.

It should be observed that the corrugated conductors 14 also form a support for the connection member 23.

There follows a description of the successive steps of a method of assembling the module 10. The method initially comprises a conventional step of bonding the first series of arcs 24a of the conductor 14 onto the conductive face 22 of the electronic component 12.

More particularly, the bonding is ultrasound welding. This type of welding serves in particular to weld a zone of the conductor 14 that is very small in area, in a manner that is under complete control. This is thus particularly suitable for welding on the electronic component 12 including the chip 16, which chip is very fragile.

Thereafter, the method comprises a step of positioning the connection member 23 in contact with a the second series of arcs 24b of each conductor 14.

This step is followed by a step of connecting the connection member 23 with the conductors 14.

In a first implementation, this connection may be no more than electrical and thermal, i.e. it transmits both electricity and heat. Under such circumstances, the connection step may comprise applying holding pressure on the connection member 23 so as to hold the connection member 23 against the conductor 14. In general, this pressure is applied by conventional resilient means in a direction normal to the conductive face 28 of the connection member 23.

In a second implementation, the connection between the connection member 23 and the conductors 14 may also be mechanical, i.e. suitable for transmitting mechanical stresses between the elements 23 and 14. Under such circumstances, the connection step includes a bonding step, e.g. a step of soldering the conductor 14 to the connection member 23. By way of example, the soldering may be performed using an alloy of lead and tin or of lead and silver.

In the second implementation, the connection step may be preceded by a step of protecting the component 12, which step may consist, for example, in depositing a layer of polymer on the electronic component 12 so that said layer covers the conductive face 82 of the component 12. With this face protected in this way, the component is not damaged during the bonding step, e.g. by a splashes of solder. Nevertheless, it is possible that the component 12 is protected in purely temporary manner in some other way.

It should be observed that the module and the method of assembling the module are not restricted to the embodiments and implementations described above.

In a variant, the conductive faces 22 and 28 of the metallic film 20 and of the connection member 23 need not be parallel, and the arcs 24*a* and 24*b* are then not of substantially the same height. Furthermore, the connection between the connection member and the conductor would be made by welding.

The invention claimed is:

1. A module of a type comprising an electronic component provided with a conductive face that is electrically connected to a connection member of the component by means of a conductor that is corrugated at least in part so as to define an alternating sequence of oppositely-directed arcs, a first series of arcs being connected to the conductive face of the electronic component, the conductor including a second series of arcs opposite to the arcs of the first series and interposed between the arcs of the first series, the second series of arcs being connected to a conductive face of the connection member, wherein the conductor is a multi-layer conductor.

2. The module according to claim 1, wherein the electronic component includes a semiconductor chip.

3. The module according to claim 1, wherein the conductor has a general shape of a tape.

4. The module according to claim 1, wherein the arcs of the conductor are of substantially constant height.

5. The module according to claim 1, constituting a power module for a motor vehicle.

6. The module according to claim 1, wherein the first series of arcs of the conductor is bonded to the electronic component.

7. A method of assembling a module according to claim 1, the method comprising at least a step of bonding the first series of arcs of the conductor to the conductive face of the electronic component, and subsequently comprising a step of positioning the connection member in contact with the second series of arcs of the conductor, followed by a step of connecting the connection member to the conductor.

8. The method according to claim 7, wherein the step of connecting the connection member to the conductor includes a step of applying holding pressure to the connection member for holding said connection member against the conductor.

9. The method according to claim 7, wherein the step of connecting the connection member to the conductor includes at least one bonding step for bonding the connection member to the conductor.

10. The method according to claim 9, wherein the step of connecting is preceded by a step of protecting the electronic component.

11. The method according to claim 10, wherein the step of protecting comprises a step of depositing a polymer layer on the electronic component so that the layer covers the conductive face of the component.

12. The method according to claim 9, wherein the at least one bonding step is performed without addition of material.

* * * * *